US011059647B2

(12) United States Patent
Kaiserman et al.

(10) Patent No.: US 11,059,647 B2
(45) Date of Patent: Jul. 13, 2021

(54) APPARATUS, SYSTEMS AND METHODS FOR IDENTIFYING PRODUCTS

(71) Applicant: T+Ink, Inc., New York, NY (US)

(72) Inventors: Terrance Z. Kaiserman, Loxahatchee, FL (US); John Gentile, Montclair, NJ (US); Steven Martin Cohen, New York, NY (US)

(73) Assignee: Touchcode Holdings, LLC, New York, NY (US)

( * ) Notice: Subject to any disclaimer, the term of this patent is extended or adjusted under 35 U.S.C. 154(b) by 0 days.

(21) Appl. No.: 15/060,551

(22) Filed: Mar. 3, 2016

(65) Prior Publication Data

US 2017/0036838 A1 Feb. 9, 2017

Related U.S. Application Data

(60) Provisional application No. 62/127,745, filed on Mar. 3, 2015.

(51) Int. Cl.
G06F 19/00 (2018.01)
B65D 79/00 (2006.01)
G06Q 10/08 (2012.01)
B65D 75/56 (2006.01)
H03K 17/00 (2006.01)
A47F 10/02 (2006.01)
G08B 13/24 (2006.01)

(52) U.S. Cl.
CPC ............ B65D 79/00 (2013.01); B65D 75/566 (2013.01); G06Q 10/08 (2013.01); H03K 17/005 (2013.01); A47F 2010/025 (2013.01); G06Q 10/087 (2013.01); G08B 13/2448 (2013.01)

(58) Field of Classification Search
CPC ............ E05B 73/0017; E05B 73/0064; G08B 13/2434; G08B 13/2448; G08B 13/1409; G06K 19/0723; G06K 19/07749
USPC ........................................................ 235/385
See application file for complete search history.

(56) References Cited

U.S. PATENT DOCUMENTS

| 2,992,625 | A | 7/1961 | Eckenbach |
| 3,426,326 | A | 2/1969 | Goldstein |
| 4,673,932 | A | 6/1987 | Ekchian et al. |
| 4,866,412 | A | 9/1989 | Rzepcynski |
| 4,881,061 | A | 11/1989 | Chambers |
| 5,065,290 | A | 11/1991 | Makar et al. |
| 5,407,050 | A | 4/1995 | Takemoto et al. |
| 5,763,058 | A | 6/1998 | Isen et al. |
| 5,771,003 | A | 6/1998 | Seymour |
| 5,799,533 | A | 9/1998 | Seki et al. |

(Continued)

FOREIGN PATENT DOCUMENTS

| DE | 4307082 A1 | 9/1994 |
| JP | H05-89301 A | 4/1993 |

(Continued)

OTHER PUBLICATIONS

International Search Report and Written Opinion for PCT/US16/20785 dated Jul. 26, 2016.

(Continued)

Primary Examiner — Thien M Le
(74) Attorney, Agent, or Firm — Wolf, Greenfield & Sacks, P.C.

(57) ABSTRACT

Apparatus, systems and methods for identifying products are described herein.

17 Claims, 1 Drawing Sheet

(56) References Cited

U.S. PATENT DOCUMENTS

| | | | |
|---|---|---|---|
| 5,801,628 A | 9/1998 | Maloney | |
| 6,029,358 A | 2/2000 | Mathiasmeier et al. | |
| 6,164,617 A | 12/2000 | Butterfield et al. | |
| 6,193,079 B1 * | 2/2001 | Wiemer | A47F 5/0823 |
| | | | 211/57.1 |
| 6,198,391 B1 | 3/2001 | DeVolpi | |
| 6,827,256 B2 | 12/2004 | Stobbe | |
| 6,837,427 B2 | 1/2005 | Overhultz et al. | |
| 7,021,535 B2 | 4/2006 | Overhultz et al. | |
| 7,102,519 B2 | 9/2006 | Lyon et al. | |
| 7,233,241 B2 | 6/2007 | Overhultz et al. | |
| 7,510,123 B2 | 3/2009 | Overhultz et al. | |
| 7,535,337 B2 | 5/2009 | Overhultz et al. | |
| 7,584,016 B2 | 9/2009 | Weaver | |
| 7,775,130 B2 | 8/2010 | Harish et al. | |
| 7,856,746 B1 * | 12/2010 | Araujo | A61M 5/1418 |
| | | | 24/487 |
| 8,056,738 B2 | 11/2011 | Phillips | |
| 8,321,304 B2 | 11/2012 | Khan et al. | |
| 8,448,521 B2 | 5/2013 | Washeleski et al. | |
| 8,473,374 B2 | 6/2013 | Allison et al. | |
| 8,915,430 B2 | 12/2014 | Shah et al. | |
| 9,123,018 B2 | 9/2015 | Gentile et al. | |
| 9,684,884 B2 | 6/2017 | Gentile et al. | |
| 9,832,644 B2 | 11/2017 | Moberg et al. | |
| 10,262,172 B1 | 4/2019 | Niranjayan et al. | |
| 2003/0039381 A1 | 2/2003 | Ziesig | |
| 2003/0063524 A1 | 4/2003 | Niemiec et al. | |
| 2004/0195319 A1 | 10/2004 | Forster | |
| 2005/0040934 A1 | 2/2005 | Shanton | |
| 2005/0242958 A1 | 3/2005 | Lyon et al. | |
| 2005/0131578 A1 | 6/2005 | Weaver | |
| 2005/0134506 A1 | 6/2005 | Egbert | |
| 2006/0071774 A1 | 4/2006 | Brown et al. | |
| 2006/0113397 A1 * | 6/2006 | Beilenhoff | G09F 3/20 |
| | | | 235/494 |
| 2007/0069867 A1 | 3/2007 | Fleisch et al. | |
| 2007/0164414 A1 | 7/2007 | Dokai et al. | |
| 2008/0052198 A1 | 2/2008 | Hosokawa | |
| 2008/0179474 A1 * | 7/2008 | Johnson | A47F 5/083 |
| | | | 248/214 |
| 2009/0020601 A1 | 1/2009 | Woodbury et al. | |
| 2009/0311456 A1 | 12/2009 | Harris | |
| 2009/0313365 A1 | 12/2009 | Whitehead | |
| 2010/0049635 A1 | 2/2010 | Delancy et al. | |
| 2010/0097191 A1 | 4/2010 | Yamagajo et al. | |
| 2011/0202170 A1 * | 8/2011 | Dawes | F25D 29/00 |
| | | | 700/215 |
| 2011/0210030 A1 | 9/2011 | Londo et al. | |
| 2011/0218889 A1 | 9/2011 | Westberg et al. | |
| 2011/0253789 A1 | 10/2011 | Thiele et al. | |
| 2011/0259953 A1 | 10/2011 | Baarman et al. | |
| 2011/0259960 A1 | 10/2011 | Baarman et al. | |
| 2012/0019385 A1 * | 1/2012 | Brodzik | G08B 13/2434 |
| | | | 340/572.9 |
| 2012/0053725 A1 | 3/2012 | Niederhuefner et al. | |
| 2012/0125993 A1 | 5/2012 | Thiele et al. | |
| 2012/0169230 A1 | 7/2012 | Lowenthal et al. | |
| 2012/0228240 A1 | 9/2012 | Gentile et al. | |
| 2012/0245969 A1 | 9/2012 | Campbell | |
| 2012/0293330 A1 | 11/2012 | Grant et al. | |
| 2012/0306813 A1 | 12/2012 | Foerster et al. | |
| 2013/0048724 A1 | 2/2013 | Burnside et al. | |
| 2013/0069908 A1 | 3/2013 | Sung | |
| 2013/0107413 A1 | 5/2013 | Moore | |
| 2013/0115878 A1 | 5/2013 | Thiele et al. | |
| 2013/0284578 A1 | 10/2013 | Foerster et al. | |
| 2013/0285681 A1 | 10/2013 | Wilson et al. | |
| 2013/0314210 A1 | 11/2013 | Schoner et al. | |
| 2014/0155540 A1 | 6/2014 | Imai et al. | |
| 2014/0218196 A1 | 8/2014 | Londo et al. | |
| 2014/0299663 A1 | 10/2014 | Shah et al. | |
| 2015/0041537 A1 | 2/2015 | Gentile et al. | |
| 2015/0041616 A1 | 2/2015 | Gentile et al. | |
| 2015/0048161 A1 | 2/2015 | Gentile et al. | |
| 2015/0082842 A1 * | 3/2015 | Appalucci | E05B 73/0017 |
| | | | 70/19 |
| 2015/0090494 A1 * | 4/2015 | Lazarev | E21B 47/122 |
| | | | 175/40 |
| 2015/0302226 A1 | 10/2015 | Li et al. | |
| 2015/0309651 A1 | 10/2015 | Papakostas | |
| 2016/0046424 A1 | 2/2016 | Marcinkowski | |
| 2016/0102483 A1 * | 4/2016 | Luo | E05B 73/0017 |
| | | | 70/57.1 |
| 2016/0132823 A1 | 5/2016 | Swafford et al. | |
| 2016/0196526 A1 | 7/2016 | Khalid et al. | |

FOREIGN PATENT DOCUMENTS

| | | |
|---|---|---|
| JP | 2002-163622 A | 6/2002 |
| WO | WO 2000/65532 A1 | 11/2000 |
| WO | WO 2006/008866 A1 | 1/2006 |
| WO | WO 2008/029405 A2 | 3/2008 |
| WO | WO 2012/176788 | 12/2012 |

OTHER PUBLICATIONS

Extended European Search Report for Application No. EP 16759539.6 dated Jul. 16, 2018.

Finkenzeller, RFID Handbuch. Carl Hanser Verlag GmbH & Co. Dec. 31, 2012;6:31-74.

* cited by examiner

APPARATUS, SYSTEMS AND METHODS FOR IDENTIFYING PRODUCTS

RELATED APPLICATIONS

This application claims priority to U.S. Provisional Application No. 62/127,745 filed Mar. 3, 2015, which is incorporated herein by reference in its entirety.

FIELD OF INVENTION

The invention is in the field of packaging and/or product identification and/or package security.

BACKGROUND OF INVENTION

There is an explosion of product tagging systems emerging, from optical bar codes and QR codes and other unique optical patterns to RFID, EZ pass, tuned resonant circuits, passive and active circuits that store energy and receive signals and retransmit signals that can be detected by external circuits and/or systems. Package identifying circuits on packages can be disabled by burning out fuse links and/or reprogramming and/or altering prior to removal from a store after purchase. Still other systems used in stores have mechanical tags or clips or at least one or two piece systems that require special tools and/or devices at the check-out area or to be used by authorized personnel which employ application of magnetic fields and or mechanical separation tools. Inventory control is a growing field, and there is increased need to determine when stock is depleted and point of purchase displays or shelves either need to be restocked with in-store inventory and/or orders placed for new products available from warehouses at distant locations. Much of this process can be automated. Just in time management of inventory is blossoming with the ease of unique product identification and the ability to detect quantity and type of product present in any area of a store. Also, product shrinkage due to theft is an ever-present problem in a world where margins are dropping, wages raising, and the need for maximal inventory control a necessity for many businesses to remain competitive while bringing cost effective products to consumers both domestically and world-wide in both mature and emerging markets.

SUMMARY OF INVENTION

Apparatus, systems and methods for identifying products are described herein.

In one aspect, a package identifying apparatus is provided. The apparatus comprises at least one first electrical contact; at least one second electrical contact; at least one passive circuit; and at least one active circuit. The system is configured to include: at least one electrical connection between said at least one first electrical contact and said at least one passive circuit and/or said at least one active circuit; and at least one electrical connection between said at least one second contact and said at least one passive circuit and/or said at least one active circuit.

In some embodiments, the apparatus comprises a package. In some cases, the package comprises the at least one first electrical contact, the at least one second electrical contact, the at least one passive circuit; and the at least one active circuit.

In some embodiments, the apparatus comprises a package and a clip coupled to the package. In some cases, the clip comprises one or more of: the first electrical contact, the at least one second electrical contact, the at least one passive circuit; and the at least one active circuit.

In some embodiments, the package includes a product.

In some embodiments, the package is configured to be hung from a peg. In some embodiments, the clip is configured to be hung from a peg.

In some embodiments, the apparatus further comprises at least one third contact in electrical contact with said at least one first contact; and at least one fourth contact in electrical contact with said at least one second contact.

In some embodiments, the at least one active circuit is a switching multiplexer configured to perform at least one of the following functions selected from the group consisting of: switches between at least one first said at least one passive circuit and at least one second said at least one passive circuit; and switches between said at least one second said at least one passive circuit and said at least one first said at least one passive circuit.

In some embodiments, said at least one active circuit is an analog multiplexer configured to connect a first said at least one passive circuit between said at least one first contact and said at least one second contact for a first period of time; and to connect a second said at least one passive circuit between said at least one first contact and said at least one second contact for a second period of time; and to connect a third said at least one passive circuit between said at least one first contact and said at least one second contact for a third period of time; and to connect a fourth said at least one passive circuit between said at least one first contact and said at least one second contact for a fourth period of time.

In one aspect, a system is provided. The system includes the above-described package identifying apparatus and a display peg. The package identifying apparatus is configured to be coupled to the display peg. The system is configured to detect an electrical signature associated with the apparatus.

In one aspect, a system is provided. The system comprises a display peg and a clip configured to be coupled to the display peg. The system further comprises a package configured to be coupled to the clip, wherein a product is in the package. The system is configured to detect an electrical signature associated with the package to identify the product.

In some embodiments, the clip is configured to hang from the display peg.

In some embodiments, the package is configured to hang from the clip.

In some embodiments, the display peg includes a first electrical contact and a second electrical contact.

In some embodiments, the clip includes a third electrical contact and a fourth electrical contact. In some cases, the third electrical contact is configured to be coupled to the first electrical contact and the fourth electrical contact is configured to be coupled to the second electrical contact.

In some embodiments, the clip includes electrical connections designed to permit electrical signals to pass between the package and the display peg.

In some embodiments, the system includes external circuitry configured to detect an electrical signature associated with the package to identify the product.

In some embodiments, a package and/or product identifying device can create a unique electrical signature that can be detected by external circuitry. This can be used as a stand-alone subsystem that can be attached to or be incorporated within a hang tag item or product package and/or hang tag product package that can be hung from a mechanical support peg that can generate the necessary signals and/or contains or is connected to the necessary receptive circuitry that can interpret signals generated by or the signature of the stand-alone subsystem. The package and/or product identifying device can also be used with and attached to at least one other type of security device or clip.

In one embodiment the apparatus and systems can pass signals from circuitry resident on the hang tag product package to the conductive elements on a peg upon which the hang tag product package is physically hung, as might be used at a point of purchase display or shelf in a store or product display area. For example, there can be at least two conductive contacts on the hang tag product package, and there can be a resister and/or impedance between at least two of these contacts. When the hang tag product package is placed on the peg, the resistance and/or impedance on the hang tag product package can be placed or connected between at least two conductive elements on the peg, and this resistance and/or impedance can be detected by circuitry. If the hang tag product package is removed from the peg, the absence of the resistance and/or impedance can be detected. The resistor and/or impedance can be a multiplicity of resistances and/or impedances and different resistances and/or impedances can denote or be correlated with different products. For instance, product A can have one resistance, product B can have another resistance, and product C can have still another resistance, and so on, with any number of products having any number of resistances. By measuring the resistance between the contacts on any particular hang tag product package, a unique identification can be made. The same resistances can be used for different types of products in spatially separated locations, and unique identification can still be made. As a further example, and only as an example which does not limit the scope and spirit of the invention, a 110K (where K=1,000 ohms) resistance on a shaving razor package at the shaving razor point of purchase display would not be confused with a toothbrush package also containing a 110K resistor because toothbrushes would be on a different point of purchase display rack then the shaving razor point of purchase display. If resistances were altered in 10K increments it would be possible to identify 100 different package types in the resistance range between 110K and 1.1M (where M=1,000, 000 ohms). These numbers are hypothetical and used for example only. There can be other differential resistances and different minimum and maximum resistance values, and resistance can also be an impedance containing capacitance and/or inductance components, as well as active circuits.

In another embodiment, multiple resistances can be contained on the same hang tag product package, and multiple measurements can be made to increase the number of packages that can be identified. In such a scenario, if one of a hundred (for illustrative purposes only) resistances were possible, an encoding method could switch between one resistance for one period of time and a second resistance for a second period of time, thus producing 10,000 possible resistance combinations if resistance alone is used for encoding combinations. But by controlling the time any particular resistance is connected between two terminals, the number of combinations can be dramatically increased. If one thousand time increments are quantified (for illustrative purposes only), which is very easy to do with cost effective electronic timers and counting circuits and/or software, one million time combinations are possible, and when multiplied by 10,000 resistance combinations, this produces 10 billion combinations of unique identifications. Stated more generally, the apparatus and systems in some embodiments can comprise at least one active circuit that can be a switching and/or analog multiplexer that performs at least one of the following functions: switches between at least one first passive circuit and at least one second passive circuit, switches between at least one second passive circuit and at least one first passive circuit, an analog multiplexer can connect a first passive circuit between at least one first contact and at least one second contact for a first period of time, an analog multiplexer can connect a second passive circuit between at least one first contact and at least one second contact for a second period of time, an analog multiplexer can connect a third passive circuit between at least one first contact and at least one second contact for a third period of time, and/or an analog multiplexer can connect a fourth passive circuit between at least one first contact and at least one second contact for a fourth period of time.

In another embodiment, a separate clip can be attached to the hang tag product package, and this can enable at least one electrical contact between the clip and the hang tag product package. The clip can have a hole through which the peg can pass, so instead of the hang tag product package fitting over and hanging from the peg, the clip can hang from and fit over the peg, and the hang tag product package can be attached to the clip with corresponding signals passing between the clip and the hang tag product package. So effectively the resistance and/or impedance can be measured directly across the contacts on the hang tag product package or from the clip when the clip is attached to the hang tag product package. In this arrangement, the clip is merely an extension of the hang tag product package and in series with the hang tag product package.

The hang tag product package can be an identifying device comprising at least one of at least one first contact, at least one second contact, at least one passive circuit, at least one active circuit, at least one connection between at least one first contact and at least one passive circuit and/or at least one active circuit, and at least one connection between at least one second contact and at least one passive circuit and/or at least one active circuit. To accommodate the clip, the hang tag product package can further comprise at least one third contact in electrical contact with at least one first contact and at least one fourth contact in electrical contact with at least one second contact. So the hang tag product package can either connect to the peg directly via at least one first contact and at least one second contact, or the clip can make electrical connection with at least one third contact on the hang tag product package which is in electrical contact with at least one first contact on the hang tag product package and at least one fourth contact on the hang tag product package which is in electrical contact with at least one second contact on the hang tag product package. In this manner, a resistance and/or impedance and/or passive circuit and/or active circuit can be connected to the clip. The clip can further have contacts of its own which can transmit all signals from the hang tag product package to the peg when the clip is both attached to the hang tag product package and placed on the peg, thus the clip allows signals from the hang tag product package to pass through the clip, and the clip merely serves as an extension device in series with the hang tag product package and the peg. The clip can also have circuitry of its own in addition to allowing passage of signals from and/or to the hang tag product package to pass through the clip in either direction to and/or from the peg.

The resistance on the hang tag product package can be more than a simple resistance and can be any impedance possessing both real and imaginary components, and is thus not limited to resistance or a predominantly resistive component. There can be capacitive components and/or inductive components as well. There can also be non-linear components such as including but not limited to at least one of diodes, LEDs, diacs, varistors, Zener diodes or other non-linear components. There can be active components including but not limited to transistors, FETs, JFETs, SCRs, Triacs, and/or other components capable of producing current and/or voltage gain and/or electrical switching with and without hysteresis. There can also be integrated circuits including but not limited to at least one of at least one microprocessor, memory, small scale integrated chip, operational amplifier, analog gate, analog gate array, inverter, buffer, large scale integrated clip, arithmetic logic unit, programmable logic array, digital signal processing chip, transistor and/or semiconductor array or any combination thereof.

In other embodiments there can also be at least one of a photo sensor of a passive or active semiconductor technology, a thermal sensor, thermister, thermocouple, semiconductor element possessing a variable and measurable characteristic as a function of temperature, infrared sensor, bimetallic strip, or technology now known or unknown that does not deviate from the spirit of the invention. There can also be at least one audio producing element such as including but not limited to a dynamic speaker, piezoelectric speaker and/or element, capacitive speaker, all or any of which can produce acoustic energy in the human audio range and/or ultra-sonic audio range.

All resistors can be at least one of printed upon at least one substrate, discrete, and/or surface mount. All capacitors can be at least one of printed upon at least one substrate, discrete, and/or surface mount. All inductors can be at least one of printed upon at least one substrate, discrete, and/or surface mount.

All conductive traces can be at least one of metal foil, metal deposition, wire, nanotubes, semiconductor material, 3D printed using conductive materials, conductive ink printed using at least one of screen printing, offset printing, lithography, ink jet, plotter, letter press, flexography, roto gravure, various coating methods for example, slot die, reverse roll coat, knife coat and/or formed on a film and then inserted into the injection molding machine to make an in mold electronics piece, heat transferred, cold transferred, both hot and cold foil, transferred from release liner in the molding process to make an in mold decorated piece, sprayed on, sputtered. These are examples of the various types of methods to have conductive traces embedded onto or within an injection molded or blow molded plastic piece. These examples are not meant to limit the application method but to give examples of some of the various ways conductors can be incorporated into the final product.

In some embodiments, the peg may provide DC power of any polarity and/or an AC signal of any frequency and amplitude and source impedance or any combination thereof.

In another embodiment, separation can be detected between the clip and the hang tag product package as long as the clip remains on the peg. For example, there could be a first resistance between a first upper left contact and a first upper right contact within the clip and both these contacts can connect with two conductive terminals on the peg. The hang tag product package can have a second resistance in series with a diode (though not limited to a diode), and this series combination is either in parallel with the first resistance if the hang tag product package is connected to the clip or it is not connected if the hang tag product package is not connected to the clip. If the hang tag product package is connected to the clip, in one polarity of applied voltage to the first upper left contact and a first upper right contact the first resistance will be approximately in parallel with the second resistance, and when the reverse polarity of voltage is applied only the first resistance will be detected. The fact that there are two separate measured resistances may be an indication that the clip and the hang tag product package are connected. If, however, the clip and the hang tag product package are separated, only the first resistance may be measured in either polarity of applied voltage, and this can be a product tampering detection method. There are many other methods of detecting separation between the clip and the hang tag product package and the above example is just one of many methods. As another example, there can be a pair of contacts that are shorted when the clip and the hang tag product package are mated, and the same pair of contacts produce an open circuit when the clip and the hang tag product package are not mated and thus separated. There are many ways to detect separation, and all fall within the spirit of the invention.

In other embodiments, there can be at least one power source located on the hang tag product package and/or the clip. This power source can be at least one battery, capacitor, and/or electromagnetic receiver. This power can be available when the combination of the clip and/or the hang tag product package is removed from the peg. If, for example, the hang tag product package and/or the clip is placed in a faraday cage or dark place the absence of or sudden disappearance of a signal generated from the clip and/or the hang tag product package can alert store security that a potential problem exists or that there is a product theft in progress. Several non-limiting scenarios are as follows where a clip is mated to a hang tag product package and the clip is hanging from a peg and/or peg:

Scenario 1: If the clip and mated hang tag product package are removed from the peg, upon sensing this event, a removal from peg signal is generated from either the clip and/or the hang tag product package, and this removal from peg signal can be sensed by any number of receivers throughout the store. If the product appears at the register for purchase, the clip and hang tag product package are separated and the removal from peg signal is disabled in an orderly manner.

Scenario 2: If the clip and mated hang tag product package are removed from the peg, upon sensing this event, a removal from peg signal is generated from either the clip and/or the hang tag product package, and this removal from peg signal can be sensed by any number of receivers throughout the store. If, however the clip is separated from the hang tag product package the clip and/or the hang tag product package can sense this and a special distress signal can be generated to indicate product tampering and to alert store security.

Scenario 3: If the clip and mated hang tag product package are removed from the peg, upon sensing this event, a removal from peg signal is generated from either the clip and/or the hang tag product package, and this removal from peg signal can be sensed by any number of receivers throughout the store. If the removal from peg signal disappears before the product should appear at the register, this can alert store security that the combination of clip and mated hang tag product package may have been placed in a faraday cage.

Scenario 4: If the clip and mated hang tag product package are separated from one another while the clip is still on the peg, either the clip and/or the hang tag product package can generate a distress signal to indicate product tampering.

The alert of store security can evoke any number of actions including but not limited to an indication of which product from which point of purchase display has been tampered with or which product at which location there may be a potential product with. Store security cameras can be reviewed, or security personal can be dispatched to the site. What specific action is taken is store specific.

In another embodiment, the clip can detect the presence of the hang tag product package in at least one of the following methods including but not limited to completion of at least one electrical continuity, mechanically closing a switch located within the clip, changing at least one parameter including at least one of changing at least one capacitance, changing at least one inductance, changing at least one resistance, changing at least one complex impedance, detecting change in proximity, detecting at least one change in frequency, detecting at least one signal amplitude, detecting at least one phase shift of at least one signal, detecting at least one modulation pattern, detecting at least one sequence of at least one signal. The lip and/or hang tag product package can further generate all the necessary signals to detect at least one change in at least one parameter and transmit change in at least one of generating at least one of RF signal, Bluetooth signal, wireless signal, AM signal, FM signal, spread spectrum signal. The clip and/or hang tag product package can receive power from at least one battery, at least one capacitor, an external AC and/or DC source, the peg, an RF source and/or electromagnetic field. The clip and/or hang tag product package can store sufficient energy to transmit a message that can be received by at least one of an external RF and/or microwave receiver, an optical receiver in the visible, IR, or UV band, a smart phone and/or smart device, another clip and/or hang tag product package.

There are many methods of generating signals in any number of bands within the electromagnetic spectrum including but not limited to RFID, Bluetooth signal, AM signal generation, FM signal generation, spread spectrum signal generation, IR, UV, visible, coherent and incoherent signal sources, and there can be numerous data encoding methods with or without encryption, all of which would fall within the spirit of the invention.

In some embodiments, electrical contacts are passed from the hang tag package to the security device or peg (or equivalent), and the security device or peg (or equivalent) can pass signals to the peg.

Besides allowing a direct connection between the hang tag product package and the clip by having at least one conductive element coming into intimate contact with at least one other conductive element to cause electrical continuity between at least one contact, the means of communication between the hang tag product package and the clip can be capacitive and/or inductive. In a capacitive coupling embodiment when the clip is mated to the hang tag product package, a first capacitive conductive area on the clip would be aligned over a first capacitive conductive area on the hang tag product package, and this would form a first capacitor, and a second capacitive conductive area on the clip would be aligned over a second capacitive conductive area on the hang tag product package, and this would form a second capacitor. The first capacitor and the second capacitor would therefore permit communication between the clip and the hang tag product package and any circuitry connected to both these capacitors. Alternatively, in an inductive coupling embodiment when the clip is mated to the hang tag product package, a first inductive area (which could be a flat inductor and/or coil acting as a transformer primary) on the clip would be aligned over a first inductive area (which could be a flat inductor and/or coil acting as a transformer secondary) on the hang tag product package, and this primary and secondary would form a first transformer, and a second inductive area (which could be a flat inductor and/or coil acting as a transformer primary) on the clip would be aligned over a second inductive area (which could be a flat inductor and/or coil acting as a transformer secondary) on the hang tag product package, and this primary and secondary would form a second transformer. The first transformer and the second transformer would therefore permit communication between the clip and the hang tag product package and any circuitry connected to both these transformers. And inductive and capacitive coupling could be combined in any number of ways to create desired circuit characteristics and correspondingly differentiable electrical signatures that can further define unique packages. In the capacitive and inductive configurations it is understood that there is an insulation layer to prevent shorting either between any first plate of any capacitor and any second plate of any capacitor and/or there is insulation between any first inductor forming a transformer primary and any second inductor forming a transformer secondary. Also, in the above examples an inductor serving as a transformer primary can also be a transformer secondary and a transformer secondary can also be a transformer primary, thus permitting signal flow direction to be either from the clip to the hang tag product package and/or from the hang tag product package to the clip.

In another embodiment, the presence and/or absence of the clip and/or hang tag product package can create itself a coupling element that can alter the frequency of a first oscillator and/or second oscillator by either employing the peg as a frequency tuning element in an external and/or internally located circuit. Further, the presence of a human body part such as including but not limited to at least one hand and/or the torso can alter the frequency of a first oscillator and/or second oscillator. The frequency of a first oscillator and/or frequency of a second oscillator can either be measured directly or the frequency of a first oscillator and/or frequency of a second oscillator can be modulated with or summed with at least one of a frequency of a first oscillator, a frequency of a second oscillator and/or a frequency of a third oscillator, and the resultant produces a product frequency that can be measured and correlated with the presence and/or absence of at least one product, clip, hang tag item, hang tag product package, and/or at least one body part and/or appendage.

Although preferred embodiments of the present invention have been described it will be understood by those skilled in the art that the present invention should not be limited to the described preferred embodiments. Rather, various changes and modifications can be made within the spirit and scope of the present invention.

COMPONENTS

Figure 1:
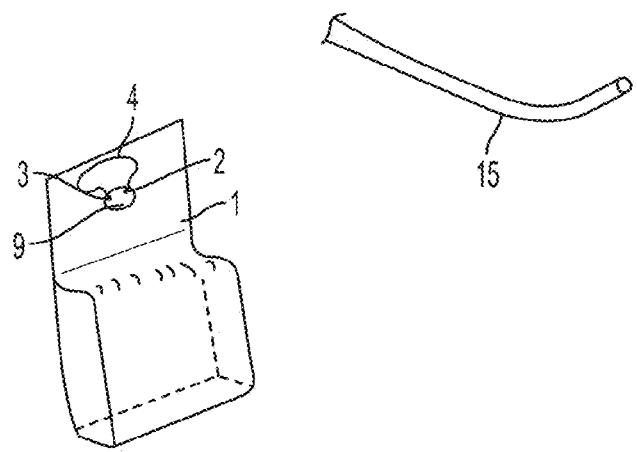
FIG. 1 depicts a representation of a stand-alone hang tag package.

Hang tag package 1
Left peg contact 2
Right peg contact 3
Resistive element 4
Resistive element 4A
Peg hole 9
Hang tag package 1A
Left peg contact 2A
Right peg contact 3A
Right contact 5
Left contact 6
Right peg contact 7
Left peg contact 8
Peg hole 9A
Auto peg or equivalent 10
Peg hole 11
Slot 12
Peg spoke 15
Resistive element 20
Lower left lower contact 21
Right lower contact 22
Lower left upper contact 23
Lower right upper contact 24
Lower left bus 25
Lower right bus 26
Hang Tag equivalent circuit 29
Upper left lower contact 31
Upper right lower contact 32
Upper left upper contact 33
Upper right upper contact 34
Upper left bus 35
Peg or equivalent circuit 39

DETAILED DESCRIPTIONS OF DRAWINGS

Apparatus, systems and methods for identifying products are described herein.

FIG. 1 depicts a representation of a stand-alone hang tag package 1. Shown is the hang tag package 1 which contains the peg hole 9 through which the peg spoke 15 passes. Within the peg hole 9 is a left peg contact 2 and a right peg contact 3, and these contacts make intimate electrical connection with corresponding contacts located on the peg spoke 15. The contacts on the peg spoke 15 are not show for clarity, but they enable, with circuitry not shown, to measure the resistance of the resistive element 4, which can be a printed element or discrete or surface mount resistor.

Figure 2A:
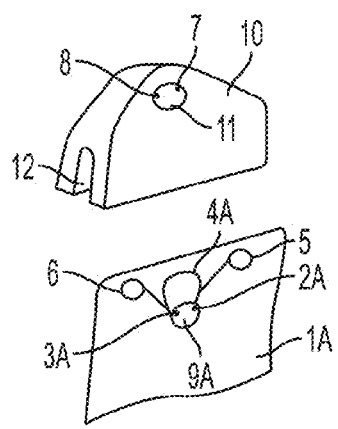
FIG. 2A depicts a representation of a stand-alone hang tag package shown below an auto peg security clip.

FIG. 2A depicts a representation of a stand-alone hang tag package 1A shown below an auto peg or equivalent 10 security clip. Shown is the hang tag package 1A which contains the peg hole 9A. Also shown is the left peg contact 2A and a right peg contact 3A, and these contacts make intimate electrical connection with corresponding contacts located on the peg spoke 15 if used as a stand-alone hang tag package 1A. Also shown is the resistive element 4A which connects on the right side to the right peg contact 2A which is also connected to right contact 5, and on the left side to left peg contact 3A which is also connected to left contact 6.

The auto Peg or equivalent 10 is shown with peg pole 11, right auto peg contact 7, and left auto peg contact 8. Also depicted is slot 12 in which hang tag package 1A can fit. An internal locking mechanism (not shown) secures the hang tag package 1A securely within the slot 12 in such a manner as to prevent removal without the use of either a magnet appropriately applied or a special removal machine at the check out counter. Located within the auto peg or equivalent 10 are a pair of connectors or electrically conductive contacts (not shown) that can make electrical contact with right contact 5 and left contact 6.

Figure 3:
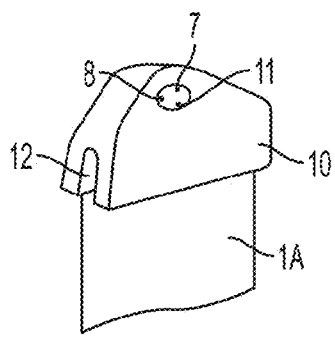
FIG. 3 depicts a representation of a stand-alone hang tag package mated with an auto peg security clip.

FIG. 3 depicts a representation of a stand-alone peg hang tag package 1A mated with an auto peg or equivalent 10 within slot 12. Also shown is peg hole 11, right auto peg contact 7, and left auto peg contact 8.

Figure 2B:
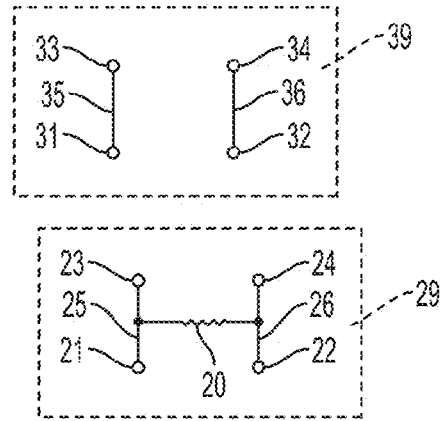
FIG. 2B depicts a schematic equivalent circuit representation of both a stand-alone hang tag package and the auto peg security clip depicted in FIG. 2A.

FIG. 2B depicts a schematic equivalent circuit representation of both a stand-alone hang tag package 1A and the auto peg or equivalent 10 security clip depicted in FIG. 2A and FIG. 3. The hang tag equivalent circuit 29 is the equivalent circuit of the hang tag package 1A and auto Peg or equivalent circuit 39 is the equivalent circuit of the auto Peg or equivalent 10. The hang tag equivalent circuit 29 shows a resistive element 20 connected between lower left bus 25 and the lower right bus 26. The lower left bus 25 is connected to lower left lower contact 21 and lower left upper contact 23. The lower right bus 26 is connected to lower right lower contact 22 and lower right upper contact 24. Auto peg or equivalent circuit 39 depicts upper left lower contact 31 connected to upper left bus 35 which is connected to upper left upper contact 33, and upper right lower contact 32 is connected to upper right bus 36 which is connected to upper right upper contact 34. The lower left lower contact 21 corresponds to the right peg contact 3A and the lower right lower contact 22 corresponds to the left peg contact 2A. The upper left upper contact 33 corresponds to the peg contact 8 and the upper right upper contact 34 corresponds to peg contact 7. When the peg or equivalent 10 is mated with the hang tag package 1A, the upper left lower contact 31 contacts the lower left upper contact 23 and the upper right lower contact 32 contacts the lower right upper contact 24, and in this manner, the resistive element 20 is connected between the left auto peg contact 8 and right auto peg contact 7, which in turn is connected to the peg spoke 15.

An auto peg may include an EAS tag, and may include the complete housing that enables attachment to a hang tag item or hang tag product package. This can be any number of items based on any number of technologies, and with modification can be used in conjunction with the apparatus described herein to permit signals to pass in at least one direction between the apparatus and the auto peg and display peg. An auto peg or equivalent or other device or embodiment which can be attached to a smart package or a hang tag or hang tag product package designed to work in a display peg system may simply be called a clip.

A clip may include an auto peg or EAS tag. A clip may also be any intermediate device or attachment system that can couple (e.g., attach) to a hang tag product package and can subsequently couple (e.g., hang) from a peg or other method for suspending and/or hanging a hang tag product package.

An EAS tag, or Electronic Article Surveillance tag may be an assembly including a circuit that can be energized by an external field. One type contains an inductor and a capacitor in a parallel circuit, and this parallel circuit produces resonance at a resonant frequency of a particular Q (The inductor and capacitor could also in another embodiment be a series arrangement rather than a parallel one). When excited by an external electromagnetic and/or electrostatic field that can be produced by at least one external coil and/or plate and/or antenna, this can be used to produce a signal that can be detected by external circuitry, and this can be used as a security device to determine if an item and/or hang tag product package is being stolen or removed from a store without having been properly removed or disabled.

A Faraday cage may be a metal cage that can shield electromagnetic radiation. A faraday cage can be made of iron and/or a magnetic and electrically conductive material, iron and/or other magnetic material screen, aluminum foil and/or conductive foils and electrically conductive materials. Typically, and in the most general case, a faraday cage can shied both magnetic and electrical fields, and a faraday cage can prevent reception by and transmission of electromagnetic radiation or electromagnetic communication signals between the inside of the faraday cage and the outside of the faraday cage. For instance, if a cell phone, transceiver of any frequency, radio receiver of any frequency, RFID tag, electromagnetically resonant system, Wi-Fi receiver and/or transmitter, EZ pass card, or other device relying on electromagnetic radiation in what is generally considered to be the sub light frequencies is placed within a faraday cage, any signal is prevented from passing into or out of the faraday cage.

A hang tag product package may be a package including a product configured to couple (e.g., hang) from a display peg. Passive and/or active signals can communicate between the hang tag product package and the peg. In one embodiment the hang tag product package can have two contacts that can contact at least two corresponding contacts on the peg, and these two or more contacts on the hang tag product package can have connected between them a resistor and/or impedance and/or an active and/or passive circuit, and this can be detected and/or measured by circuitry connected to the peg. The hang tag product package can have any number of circuits imbedded within and/or applied to it to enable detection and/or unique detection in order to differentiate between one hang tag product package and another hang tag product package.

A display peg may refer to a variety of supporting structures on which packaged products can be supported. The display peg may be supported, for example, on a peg board or other type of display. Suitable display pegs (also referred to as display hooks) have been described in U.S. Pat. No. 9,123,018 which is incorporated herein by reference in its entirety. The display peg may be made of a plastic or metal or other rigid material core. The support structure may be covered with a flexible peg sleeve. The sleeve may be adhesive backed in order to permit for the sleeve to remain affixed to the support structure.

The display peg may come in any of various shapes and sizes including a single rod straight peg, a double rod straight peg, and a U-shaped peg. Other pegs applicable to the disclosure include brackets and straight rods without any hook at the end. In some embodiments, rods are all substantially straight, parallel to the floor, and orthogonal to the display, other display hooks applicable to the disclosure may be more curved (such that any object hung on the hook slides to the minimum of the curve) and/or tilted (such that any object hung from the hook slides to the back or to the front of the hook).

As described above, the display peg may include electrical contacts (also referred to as terminals). For example, the peg can comprise positive electrical contact and negative electrical contact. The electrical terminals may be formed, printed, or otherwise fashioned (e.g., in-molding, etc.) using conductive inks or conventional circuits and circuit boards. A method by which conductive inks may be printed or formed or in-molded on surfaces has been taught in, for example, U.S. Pat. No. 8,198,979, issued Jun. 12, 2012, the disclosure of which is hereby incorporated by reference herein in its entirety. The in-molding process may involve first printing the electrical contacts on a film and then injection molding the hook into the cavity of the film. Alternatively, the electrical contacts may be printed on a release paper, instead of a film, inside the injection mold. Using a release paper will cause the contacts to be molded to the outer surface of the hook without being sealed in or covered by the film.

Some electrical contacts may be ground contacts, while others may be coupled to the electronic devices. Each contact may be electrically coupled via the electrical wiring in the display (e.g., via a circuit board, via conductive ink traces). In an example having several electrical contacts may be coupled through the display using a ribbon cable and connector. As such, each terminal may provide a separate electrical signal.

In some embodiments, the peg has at least two electrical terminals. One of the electrical terminals may be a ground terminal, grounded through the electrical wiring. The other terminal may be connected (e.g., electronically coupled) to the electronic devices such that information may be transmitted both ways between the electronic devices and a product or object hanging on the hook. The peg itself may include one or more electronic devices coupled to the terminals and to the electrical wiring (for example, as described below, the hook may include one or more LED lights capable of conveying information regarding the objects hanging on the hook or capable of conveying other information received from the electronic devices).

In some examples, at least one of the terminals may be replaced by a wireless coil. For example, the object may receive an electrical signal wirelessly at a receiver coil and then carry an electrical current from the receiver coil to a resistive element that is coupled to the hook from which the object hangs (or to another coil, such as a transmitter coil, to further wirelessly transmit the received signal).

In some examples, the electrical terminal coupled to the electronic devices may be segmented into multiple separate segments. Each segment may be capable of transmitting its own unique electrical signal, effectively establishing several electrical terminals on a single peg. The terminals may be placed on the surface of the support structure of the hook such that an object (e.g., packaged product) hung from the hook contacts the surface of the hook at the terminal. In some examples, the terminal is placed along the top surface. In other examples, for instance where the object hung from the hook is hung by a narrow hole that touches the hook on all sides of the hole, the terminal may be placed along any surface of the peg. It is generally preferable, however, to place the terminal along the upper surface since the gravitational force exerted on the object hanging from the peg generally provides for the most reliable electrical connection along the top surface of the peg.

If the peg is a single rod straight peg, each of the terminals may be formed along the top surface of the peg. Each surface may extend along the length of the peg, either along the entire length or a substantial portion of the length (e.g., half, most, 90%, up to the curved part of the hook, etc.). If a terminal is divided into several segments, each segment may occupy a distance along the length of the rod such that at any cross-section of the length of the rod, there are exactly two terminals, a ground terminal and an active terminal.

If the peg is a double rod straight hook, each rod may include a terminal. In other words, the ground terminal may be formed on the left rod and the active terminal on the opposing right rod, or vice versa. Alternatively, the terminals may be formed on the same rod of the double hook.

In some examples of the disclosure, a cross-section of a hook (one rod or two) may include more than two terminals. For instance, one terminal may be connected to ground while the other terminals may each be connected to different electronic devices (e.g., one terminal to a server, to an LED, to an alarm, to an antenna for wireless communications, etc.). In such an example, each of the terminals along the cross-section may provide the same electrical signal or different electrical signals to the electronic devices respectively.

In an example where the terminal is segmented along the length of the rod, the segments may be spaced such that one object fits per segment. For example, if a peg is designed to receive a packaged product, and the packaging of each razor is about 2 inches thick (i.e., about 5 packaged products can fit on a rod that is 10 inches long), then each segment may be about 2 inches long such that each product packaging, when hung from the rod, touches a different segment of the active electrical terminal. In this manner, each product packaging may send a different electrical signal through the rod to the electrical devices. In these examples, each segment may be connected to a different respective wire of the second ribbon cable.

While the above examples applied to a rod or hook having a flexible sleeve, in other examples, the wiring (e.g., conductive ink traces) may be printed/formed/in-molded directly to the rod/hook itself without any need for adhesive backing.

In some embodiments, systems described herein may a system that enables at least one signal to be passed down the length of a mechanical support peg, and this signal is produced by at least one passive element and/or at least one active element contained on a hang tag product package. A scenario might be a peg with a number of contacts along the length of the peg, and a hang tag product package possessing two or more contacts could make contact at one of many potential positions, and the hang tag product package would possess a resistance and/or impedance between two or more contacts, and the resistance and/or impedance of the hang tag product package could thus be read and measured by the peg and/or circuitry connected to the peg.

What is claimed is:

1. A package identifying apparatus comprising:
   at least one first electrical contact;
   at least one second electrical contact;
   at least one passive circuit;
   at least one active circuit;
   at least one third contact in electrical contact with said at least one first contact; and
   at least one fourth contact in electrical contact with said at least one second electrical contact
   wherein the system is configured to include:
   at least one electrical connection between said at least one first electrical contact and said at least one passive circuit and/or said at least one active circuit; and
   at least one electrical connection between said at least one second contact and said at least one passive circuit and/or said at least one active circuit.

2. The apparatus of claim 1, wherein the apparatus comprises a package.

3. The apparatus of claim 1, wherein the package comprises the at least one first electrical contact, the at least one second electrical contact, the at least one passive circuit; and the at least one active circuit.

4. The apparatus of claim 1, wherein the apparatus comprises a package and a clip coupled to the package.

5. The apparatus of claim 1, wherein the clip comprises one or more of: the first electrical contact, the at least one second electrical contact, the at least one passive circuit; and the at least one active circuit.

6. The apparatus of claim 1, wherein the package includes a product.

7. The apparatus of claim 1, wherein the package is configured to be hung from a peg.

8. The apparatus of claim 1, wherein the clip is configured to be hung from a peg.

9. The apparatus of claim 1, wherein said at least one active circuit is a switching multiplexer configured to perform at least one of the following functions selected from the group consisting of:
   switches between at least one first said at least one passive circuit and at least one second said at least one passive circuit; and
   switches between said at least one second said at least one passive circuit and said at least one first said at least one passive circuit.

10. The apparatus of claim 1, wherein said at least one active circuit is an analog multiplexer configured to connect a first said at least one passive circuit between said at least one first contact and said at least one second contact for a first period of time; and to connect a second said at least one passive circuit between said at least one first contact and said at least one second contact for a second period of time; and to connect a third said at least one passive circuit between said at least one first contact and said at least one second contact for a third period of time; and to connect a fourth said at least one passive circuit between said at least one first contact and said at least one second contact for a fourth period of time.

11. A system comprising:
    a display peg; and
    the package identifying apparatus of claim 1 and configured to be coupled to the display peg,
    wherein the system is configured to detect an electrical signature associated with the apparatus.

12. A system comprising:
    a display peg, wherein the display peg includes a first electrical contact and a second electrical contact;
    a clip configured to be coupled to the display peg, wherein the clip includes a third electrical contact and a fourth electrical contact;
    a package configured to be coupled to the clip, wherein a product is in the package; and
    wherein the system is configured to detect an electrical signature associated with the package to identify the product.

13. The system of claim 12, wherein the clip is configured to hang from the display peg.

14. The system of claim 12, wherein the package is configured to hang from the clip.

15. The system of claim 12, wherein the third electrical contact is configured to be coupled to the first electrical contact and the fourth electrical contact is configured to be coupled to the second electrical contact.

16. The system of claim 12, wherein the clip includes electrical connections designed to permit electrical signals to pass between the package and the display peg.

17. The system of claim 12, wherein the system includes external circuitry configured to detect an electrical signature associated with the package to identify the product.

* * * * *